United States Patent
Wang et al.

(10) Patent No.: US 10,382,232 B2
(45) Date of Patent: Aug. 13, 2019

(54) MEMORY CONTROLLER WITH ADJUSTABLE IMPEDANCE FOR OUTPUT TERMINAL

(71) Applicant: REALTEK SEMICONDUCTOR CORPORATION, Hsinchu (TW)

(72) Inventors: Shih-Hung Wang, Miaoli County (TW); Shen-Kuo Huang, Hsinchu County (TW); Gerchih Chou, San Jose, CA (US); Wen-Shan Wang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/975,821

(22) Filed: May 10, 2018

(65) Prior Publication Data

US 2019/0140867 A1 May 9, 2019

(30) Foreign Application Priority Data

Nov. 7, 2017 (TW) .............................. 106138355 A (51) Int. Cl.
G11C 7/00 (2006.01)
H04L 25/02 (2006.01)
H03H 11/30 (2006.01)
H05K 1/14 (2006.01)
G11C 16/26 (2006.01)
G11C 7/22 (2006.01)
(Continued)

(52) U.S. Cl.
CPC .......... *H04L 25/0278* (2013.01); *G06F 13/16* (2013.01); *G11C 7/222* (2013.01); *G11C 16/26* (2013.01); *H03H 7/40* (2013.01); *H03H 11/30* (2013.01); *H05K 1/141* (2013.01); *G11C 7/1057* (2013.01)

(58) Field of Classification Search
CPC ...... H04L 25/0278; H03H 7/40; H03H 11/30; G11C 7/222; G11C 16/26; H05K 1/141
USPC ....................................................... 365/189.11
See application file for complete search history.

(56) References Cited

U.S. PATENT DOCUMENTS

| 6,965,529 B2 | 11/2005 | Zumkehr et al. | |
| 2005/0012533 A1* | 1/2005 | Aoyama ................. | H03H 11/30 327/170 |
| 2008/0315913 A1* | 12/2008 | Kim ...................... | G11C 7/1057 326/30 |

OTHER PUBLICATIONS

Taiwan Patent Office "Office Action" dated Jul. 6, 2018, Taiwan. Summary of the OA letter: The cited reference has anticipated claims 1-2, 4, 6-8, and 10 and rendered claims 3 and 9 obvious.

* cited by examiner

*Primary Examiner* — Tha-O H Bui
(74) *Attorney, Agent, or Firm* — WPAT, PC (57) ABSTRACT

A memory controller adjusts impedance matching of an output terminal and outputs a control signal that controls a memory through the output terminal. The memory controller includes a first driving and impedance matching circuit, a second driving and impedance matching circuit, and a logic circuit. The logic circuit, which is coupled to the first driving and impedance matching circuit and the second driving and impedance matching circuit, sets a first impedance and a first driving capability of the first driving and impedance matching circuit, sets a second impedance and a second driving capability of the second driving and impedance matching circuit, and enables the first driving and impedance matching circuit to cause the control signal to have a first level or enables the second driving and impedance matching circuit to cause the control signal to have a second level different from the first level.

11 Claims, 5 Drawing Sheets

(51) Int. Cl.
*H03H 7/40* (2006.01)
*G06F 13/16* (2006.01)
*G11C 7/10* (2006.01)

MEMORY CONTROLLER WITH ADJUSTABLE IMPEDANCE FOR OUTPUT TERMINAL

BACKGROUND OF THE INVENTION

1. Field of the Invention

The present invention generally relates to memories, and, more particularly, to memory controllers.

2. Description of Related Art

Inside a synchronous dynamic random-access memory (SDRAM), some pins (e.g., data strobe signal pins) are provided with termination resistors, and some are not. For those pins not provided with termination resistors, to reduce signal reflection and meet the signal overshoot and undershoot requirements of the specification, matching resistors are installed on a printed circuit board (PCB) and/or the winding length on the PCB is limited. However, installing matching resistors on the PCB increases the cost, the area of the PCB, and the difficulty of circuit layout, while limiting the winding length on the PCB also increases the difficulty of circuit layout. Therefore, how to reduce the area of the PCB and the cost while meeting the requirements of the specification becomes an important issue in the circuit design of the SDRAMs.

SUMMARY OF THE INVENTION

In view of the issues of the prior art, an object of the present invention is to provide a memory controller, so as to make an improvement to the prior art.

A memory controller is disclosed. The memory controller adjusts impedance matching of an output terminal and outputs a control signal for controlling a memory through the output terminal. The memory controller includes a first driving and impedance matching circuit, a second driving and impedance matching circuit, and a logic circuit. The first driving and impedance matching circuit is coupled between a first voltage and the output terminal. The second driving and impedance matching circuit is coupled between a second voltage and the output terminal. The second voltage is different from the first voltage. The logic circuit, which is coupled to the first driving and impedance matching circuit and the second driving and impedance matching circuit, sets a first impedance and a first driving capability of the first driving and impedance matching circuit, sets a second impedance and a second driving capability of the second driving and impedance matching circuit, and enables the first driving and impedance matching circuit so that the control signal has a first level or enables the second driving and impedance matching circuit so that the control signal has a second level different from the first level.

A memory controller is disclosed. The memory controller adjusts impedance matching of an output terminal and outputs a control signal for controlling a memory through the output terminal. The memory controller includes a first driving circuit, a second driving circuit, an impedance matching circuit, and a logic circuit. The first driving circuit is coupled between a first voltage and the output terminal. The second driving circuit is coupled between a second voltage and the output terminal. The second voltage is different from the first voltage. The impedance matching circuit is coupled between the first voltage and the output terminal or between the second voltage and the output terminal. The logic circuit, which is coupled to the first driving circuit, the second driving circuit, and the impedance matching circuit, sets a first driving capability of the first driving circuit, a second driving capability of the second driving circuit, and the impedance of the impedance matching circuit, and enables the first driving circuit so that the control signal has a first level or enables the second driving circuit so that the control signal has a second level different from the first level.

The memory controller of the present invention has the function of impedance matching. When using the memory controller of the present invention, there is no need to provide additional matching resistors on the circuit board and no need to limit the winding length on the PCB. Compared with the conventional technology, the present invention makes the implementation of the circuit easier, and has the advantages of reducing the area of the PCB, reducing the cost, and meeting the requirements of the specification.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a memory controller. On account of that some or all elements of the memory controller could be known, the detail of such elements is omitted provided that such detail has little to do with the features of this disclosure and this omission nowhere dissatisfies the specification and enablement requirements. People of ordinary skill in the art can choose components equivalent to those described in this specification to carry out the present invention, which means that the scope of this invention is not limited to the embodiments in the specification.

Figure 1:
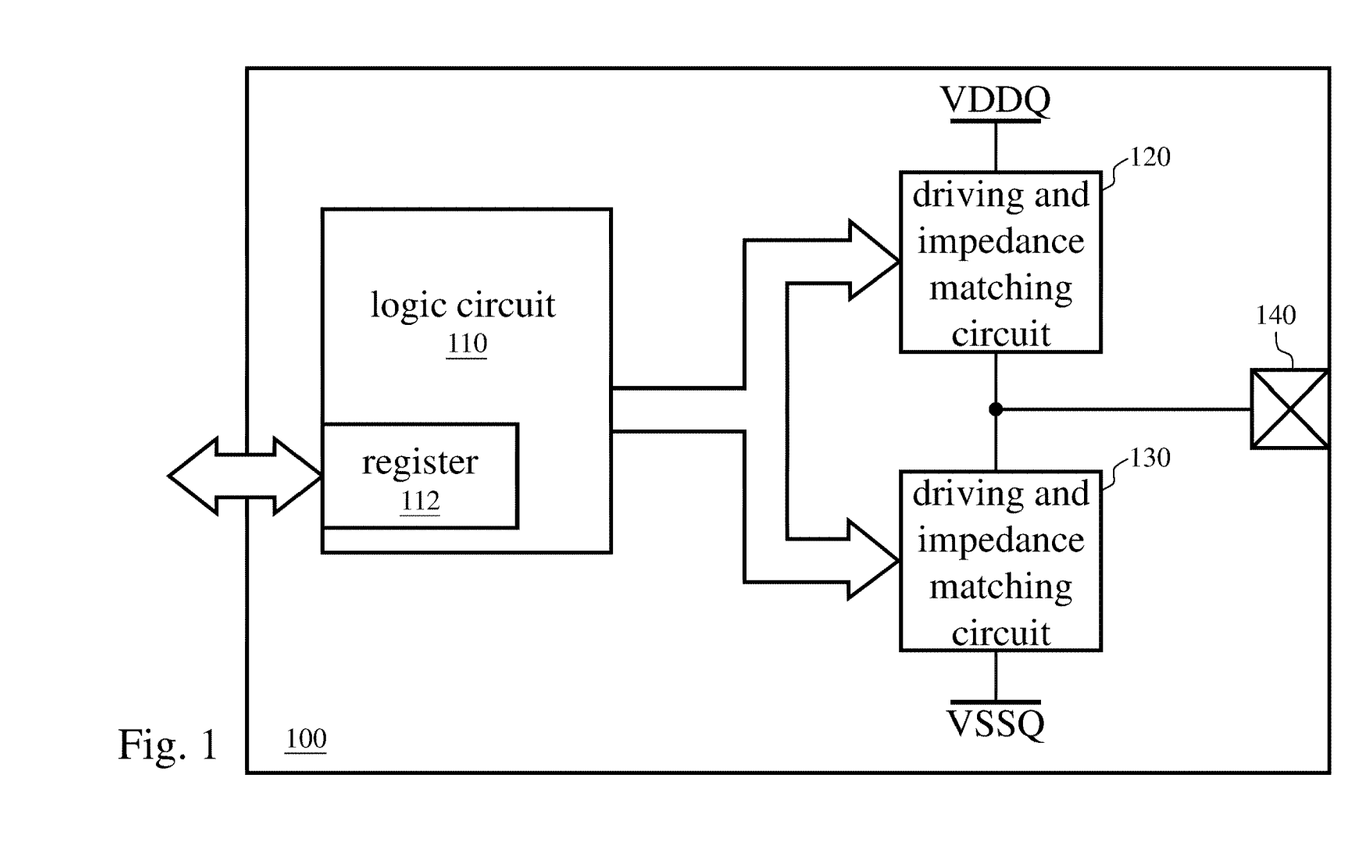
FIG. 1 illustrates a functional block diagram of a memory controller according to an embodiment of the present invention.

FIG. 1 is a functional block diagram of a memory controller according to an embodiment of the present invention. The memory controller 100 includes a logic circuit 110, a driving and impedance matching circuit 120, a driving and impedance matching circuit 130, and an output terminal 140. The memory controller 100 can output the control signal through the output terminal 140 to control the synchronous dynamic random-access memories (SDRAMs) or other types of memories. The driving and impedance matching circuit 120 and the driving and impedance matching circuit 130 are connected in series between the voltage VDDQ and the voltage VSSQ, and the voltage VDDQ is different from the voltage VSSQ. In some embodiments, the voltage VDDQ may be the positive voltage source of the circuit, and the voltage VSSQ may be the negative voltage source of the circuit or ground. After receiving a memory access signal or a setting signal, the logic circuit 110 temporarily stores the control value corresponding to the memory access signal or the setting signal into the register 112 inside the logic circuit 110. The memory access signal may come from a processing unit (such as a central processing unit, a micro-controller, a microprocessor, etc.) of the electronic device incorporating the memory controller 100, and the setting signal may also come from the processing unit or other setting circuits.

The logic circuit 110 enables the driving and impedance matching circuit 120 and/or the driving and impedance matching circuit 130 according to the control value corresponding to the memory access signal. When enabled, the driving and impedance matching circuit 120 pulls up the signal level of the output terminal 140. When enabled, the driving and impedance matching circuit 130 pulls down the signal level of the output terminal 140. In some embodiments, the logic circuit 110 may simultaneously or non-simultaneously enable the impedance matching circuit 120 and the driving and impedance matching circuit 130.

The logic circuit 110 controls the impedance and/or the driving capability of the driving and impedance matching circuit 120 and the driving and impedance matching circuit 130 according to the control value corresponding to the setting signal.

Figure 2:
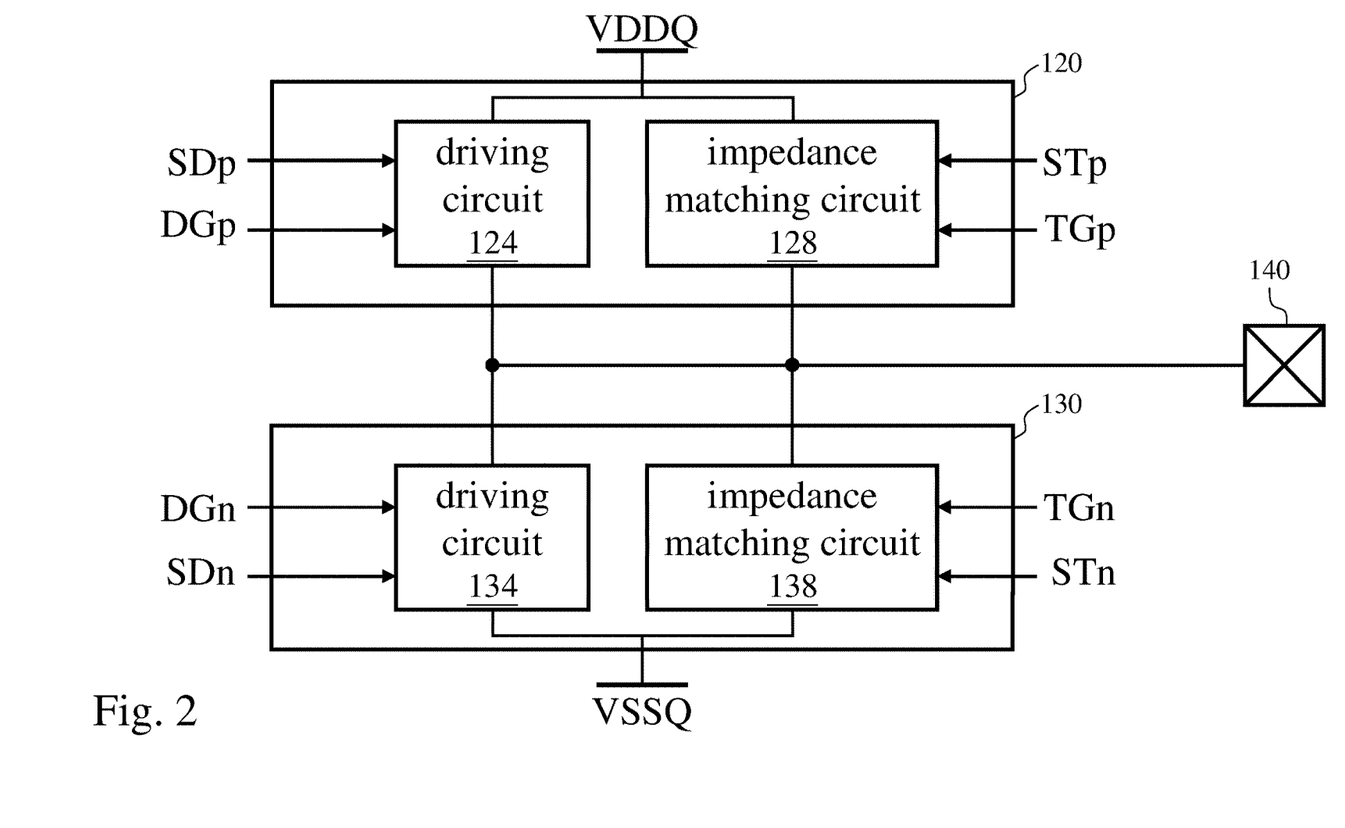
FIG. 2 illustrates a circuit diagram of a driving and impedance matching circuit according to an embodiment of the present invention.

FIG. 2 is a circuit diagram of a driving and impedance matching circuit according to an embodiment of the present invention. The driving and impedance matching circuit 120 includes a driving circuit 124 and an impedance matching circuit 128; the driving and impedance matching circuit 130 includes a driving circuit 134 and an impedance matching circuit 138. The driving circuit 124 and the driving circuit 134 each include at least one driving unit. The impedance matching circuit 128 and the impedance matching circuit 138 each include at least one impedance matching unit. The four control values SDp, STp, SDn, and STn correspond to the setting signal. The control value SDp controls the number of parallelly-connected driving units in the driving circuit 124. The control value STp controls the number of parallelly-connected impedance matching units in the impedance matching circuit 128. The control value SDn controls the number of parallelly-connected driving units in the driving circuit 134. The control value STn controls the number of parallelly-connected impedance matching units in the impedance matching circuit 138. The control value DGp and the control value DGn correspond to the memory access signal. The control value DGp can enable or disable the driving circuit 124; that is, the control value DGp can control the driving units in the driving circuit 124 to turn on or off. The control value DGn can enable or disable the driving circuit 134; that is, the control value DGn can control the driving units in the driving circuit 134 to turn on or off. The control value TGp controls the impedance matching units in the impedance matching circuit 128 to turn on or off. The control value TGn controls the impedance matching units in the impedance matching circuit 138 to turn on or off.

The foregoing driving units and impedance matching units can be implemented by transistors such as metal-oxide-semiconductor field-effect transistors (MOSFETs), bipolar junction transistors (BJTs), or other types of transistors. The details of the driving circuit 124, the impedance matching circuit 128, the driving circuit 134, and the impedance matching circuit 138 are discussed below using MOSFETs as an example; however, those of ordinary skill in the art may know the details of implementing the present invention with other types of transistors according to the disclosure below.

Figure 3:
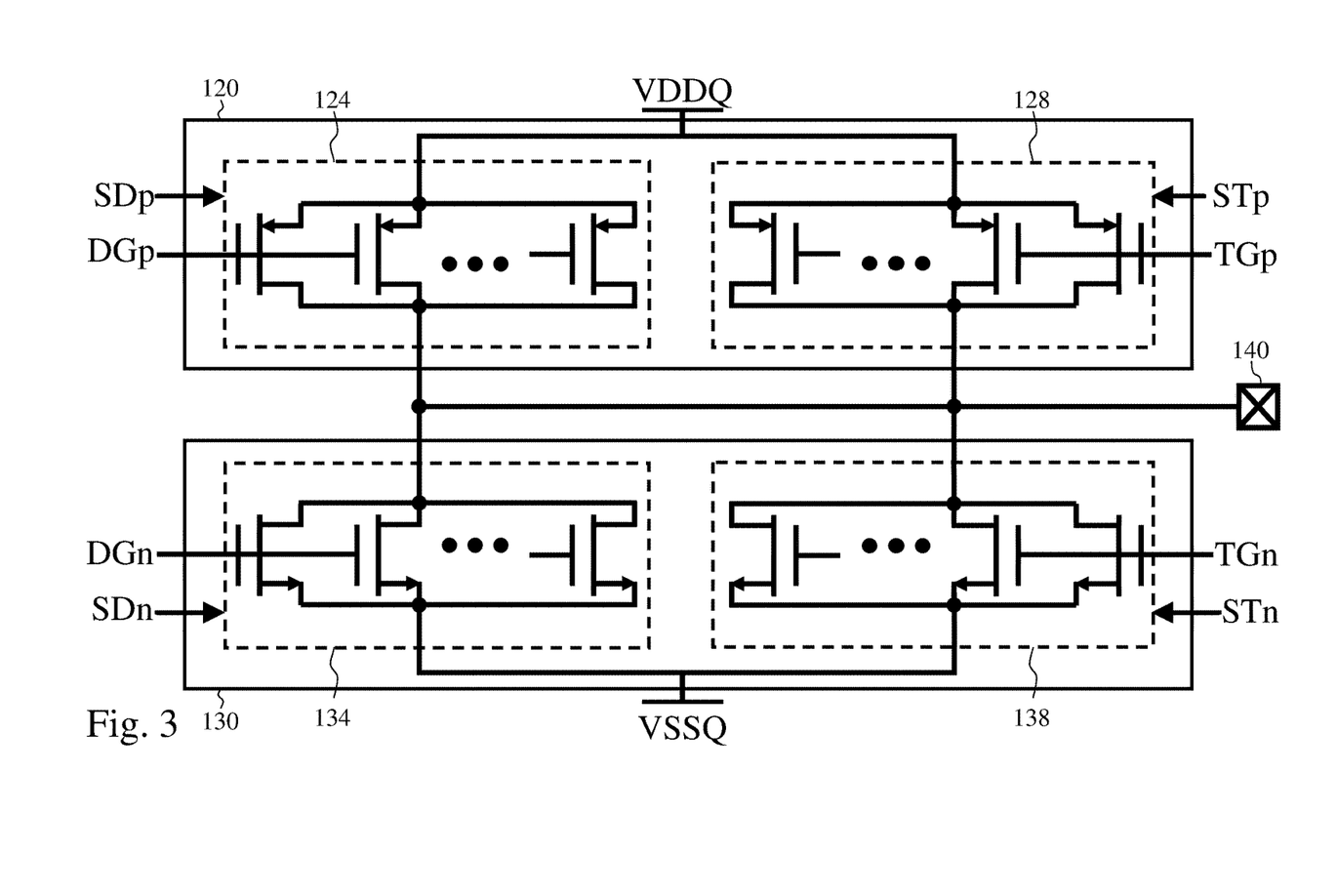
FIG. 3 illustrates a detailed circuit diagram of the driving and impedance matching circuit implemented by MOSFETs according to an embodiment of the present invention.

FIG. 3 is a detailed circuit diagram of the driving and impedance matching circuit implemented by MOSFETs according to an embodiment of the present invention. In the embodiment shown in FIG. 3, the driving circuit 124 and the impedance matching circuit 128 are implemented by transistor arrays made up of P-type metal-oxide-semiconductor field-effect transistors (PMOSFETs); the driving circuit 134 and the impedance matching circuit 138 are implemented by transistor arrays made up of N-type metal-oxide-semiconductor field-effect transistors (NMOSFETs). When two transistors are connected in parallel, their gates are electrically connected to each other, their drains are electrically connected to each other, and their sources are electrically connected to each other. In some embodiments, in the driving circuit 124, the impedance matching circuit 128, the driving circuit 134, and the impedance matching circuit 138, the drain and the source of each transistor are respectively connected to the drain and the source of an adjacent transistor through the switches. The switches are controlled by the control values SDp, STp, SDn and STn; in other words, the number of transistors connected in parallel can be adjusted by changing the control values.

When the number of parallelly-connected transistors in the driving circuit 124 (or the driving circuit 134) becomes greater, the driving circuit 124 (or the driving circuit 134) has a stronger driving capability; that is, the driving circuit 124 has a stronger pull-up capability while the driving circuit 134 has a stronger pull-down capability. When the number of parallelly-connected transistors in the impedance matching circuit 128 (or the impedance matching circuit 138) becomes greater, the impedance matching circuit 128 (or the impedance matching circuit 138) has a lower impedance; that is, the equivalent impedance between the output terminal 140 and the voltage VDDQ (or the voltage VSSQ) becomes lower.

Figure 4:
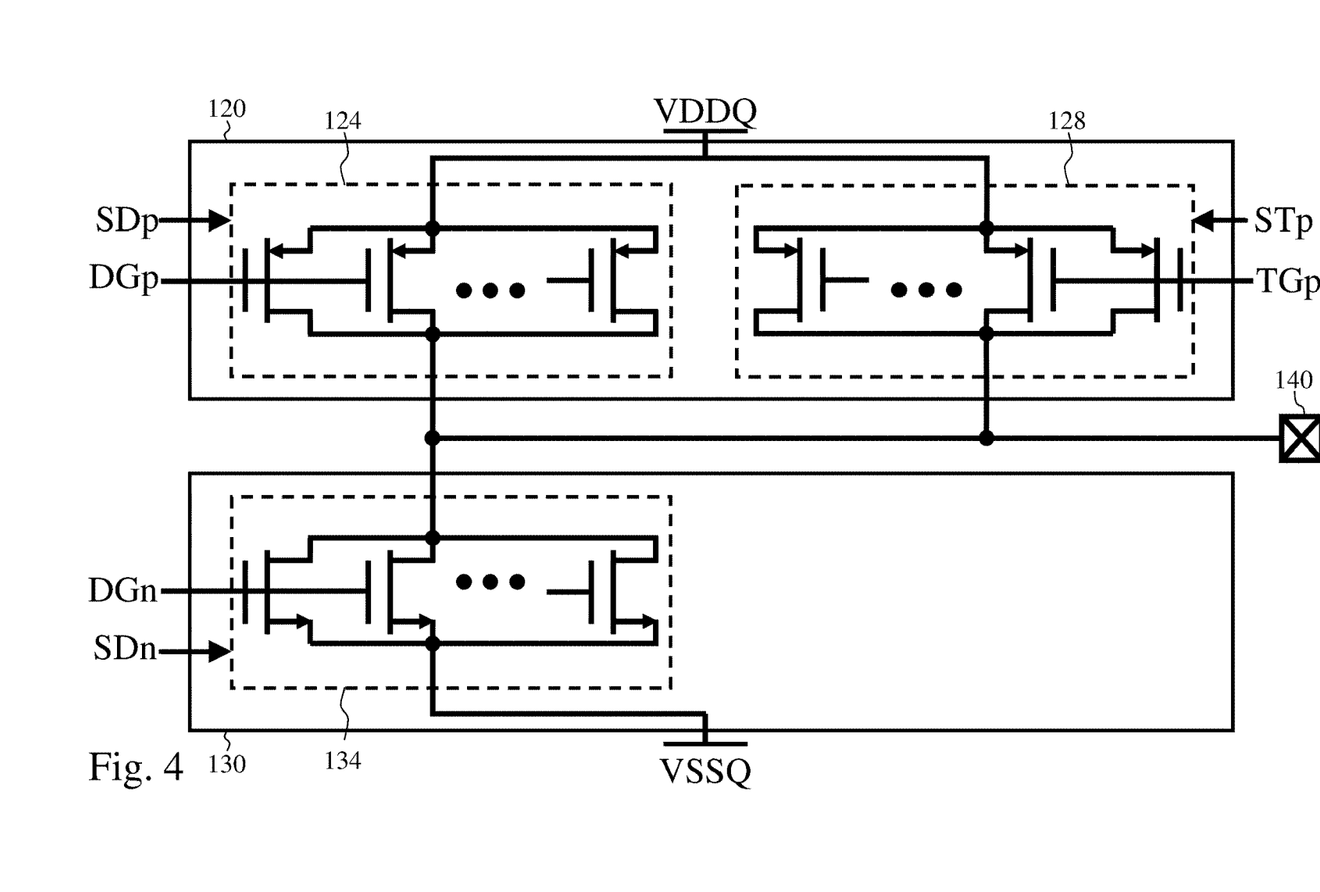
FIG. 4 illustrates a detailed circuit diagram of the driving and impedance matching circuit implemented by MOSFETs according to another embodiment of the present invention.
Figure 5:
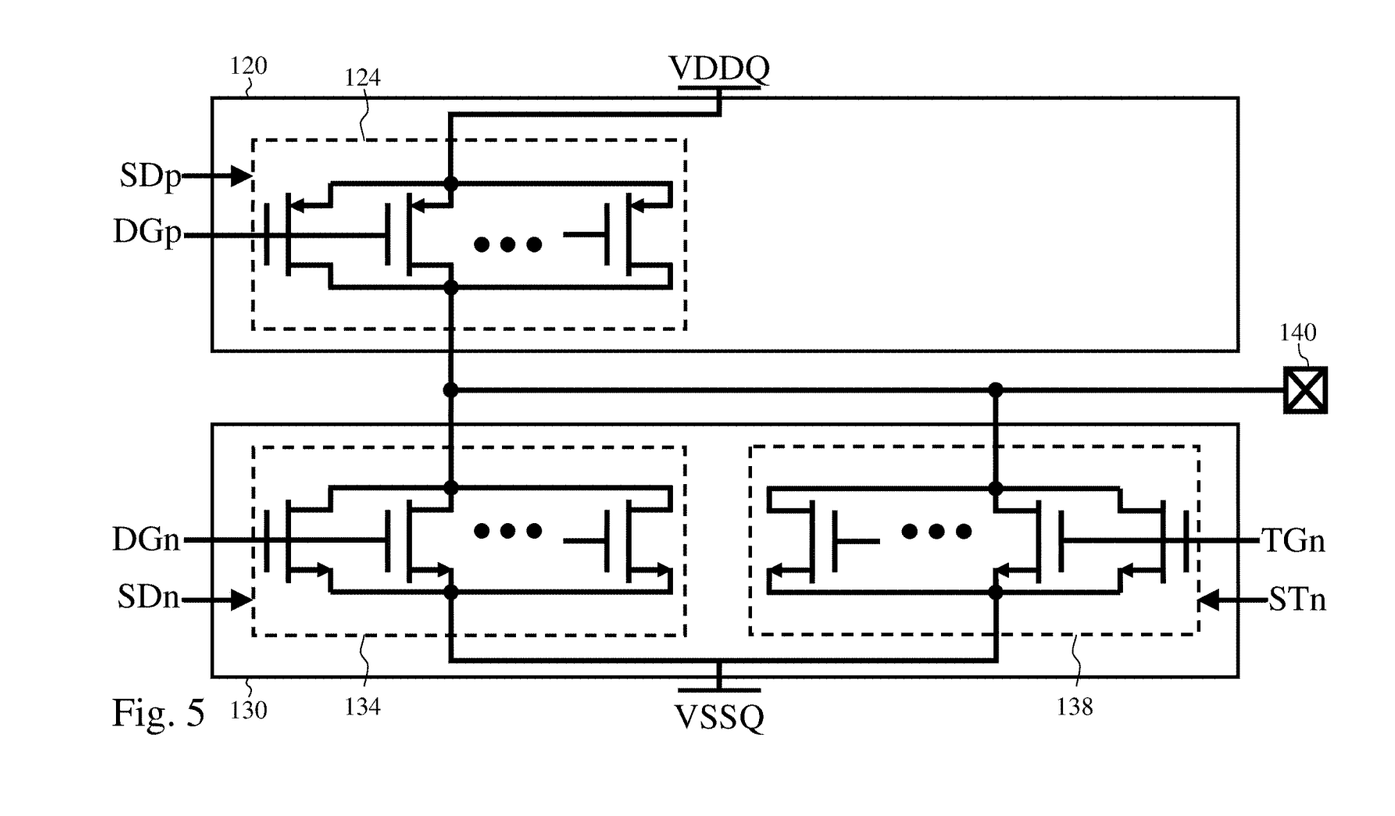
FIG. 5 illustrates a detailed circuit diagram of the driving and impedance matching circuit implemented by MOSFETs according to another embodiment of the present invention.

In some embodiments, the impedance matching circuit 128 and the impedance matching circuit 138 may be adjusted to have the same impedance or similar impedances by adjusting the control values STp and STn. When the impedance matching circuit 128 and the impedance matching circuit 138 have the same impedance or similar impedances, the common-mode voltage of the output terminal 140 is substantially equal to the middle of the voltage VDDQ and the voltage VSSQ. In other embodiments, only one of the impedance matching circuit 128 and the impedance matching circuit 138 may be adjusted; that is, the equivalent impedance of the output terminal 140 may be adjusted by adjusting the number of parallelly-connected transistors in only one of the impedance matching circuit 128 and the impedance matching circuit 138. In other embodiments, the impedance matching circuit 128 or the impedance matching circuit 138 may be omitted (as shown in FIG. 4 or FIG. 5).

The control value DGp and the control value DGn correspond to the memory access signal. The control value DGp can enable or disable the driving circuit 124; that is, the control value DGp can control the parallelly-connected transistors in the driving circuit 124 to turn on or off at the same time. The control value DGn can enable or disable the driving circuit 134; that is, the control value DGn can control the parallelly-connected transistors in the driving circuit 134 to turn on or off at the same time. When the logic circuit 110 is to pull up the voltage of the output terminal 140 (for example, to make the control signal have a first level), the control value DGp controls at least one transistor in the driving circuit 124 to turn on (i.e., the number of parallelly-connected transistors in the driving circuit 124 is equal to or greater than one), and the control value DGn controls all transistors in the driving circuit 134 to turn off. When the logic circuit 110 is to pull down the voltage of the output terminal 140 (for example, to make the control signal have a second level different from the first level), the control value DGn controls at least one transistor in the driving circuit 134 to turn on (i.e., the number of parallelly-connected transistors in the driving circuit 134 is equal to or greater than one), and the control value DGp controls all transistors in the driving circuit 124 to turn off. As shown in the embodiment of FIG. 3, when the transistors of the driving circuit 124 are implemented by PMOSFETs and the transistors of the driving circuit 134 are implemented by NMOSFETs, the control value DGp is the inversion of the control value DGn.

The control value TGp controls the parallelly-connected transistors in the impedance matching circuit 128 to turn on or off at the same time. When the control value TGp controls all transistors in the impedance matching circuit 128 to turn off, the equivalent circuit of FIG. 3 is as shown in FIG. 5. The control value TGn controls the parallelly-connected transistors in the impedance matching circuit 138 to turn on or off at the same time. When the control value TGn controls all transistors in the impedance matching circuit 138 to turn off, the equivalent circuit of FIG. 3 is as shown in FIG. 4. In the embodiment shown in FIG. 3, since the transistors of the impedance matching circuit 128 are implemented by PMOSFETs, the control value TGp is low level, and since the transistors of the impedance matching circuit 138 are implemented by NMOSFETs, the control value TGn is high level. In some embodiments, the level of the control value TGp is independent of whether the driving and impedance matching circuit 120 is enabled or not, and the level of the control value TGn is independent of whether the driving and impedance matching circuit 130 is enabled or not. In other words, the equivalent impedance of the output terminal 140 is not affected by whether the driving and impedance matching circuit 120 and the driving and impedance matching circuit 130 are enabled or not. In some embodiments, the control value TGp and/or the control value TGn are maintained at a fixed level so that the parallelly-connected transistors in the impedance matching circuit 128 and the impedance matching circuit 138 remain turned on or off regardless of whether the driving and impedance matching circuit 120 and the driving and impedance matching circuit 130 are enabled or disabled.

In some embodiments, the memory controller 100 can output memory address commands through the output terminal 140, but is not limited thereto. More specifically, the aforementioned memory access signals may correspond to memory address commands. For example, when a certain bit of an address command is a first logic value, the control value DGp and the control value DGn corresponding to the bit are respectively the first level and the second level; when the bit of the address command is a second logic value, the control value DGp and the control value DGn corresponding to the bit are respectively the second level and the first level.

The memory controller of the present invention is suitable for multi-chip module (MCM) package because there is no need to install additional matching resistors outside the chip. The present invention can reduce the signal amplitude to meet the signal overshoot and undershoot requirements of the specification while keeping the common mode voltage unchanged (for example, by setting the impedances of the driving and impedance matching circuit 120 and the driving and impedance matching circuit 130 substantially the same). More specifically, the present invention can control the amplitude of the signal to be in a range between the voltage VDDQ plus a maximum amplitude and the voltage VSSQ minus the maximum amplitude. In addition, the present invention can also meet the requirements of the height and the width of the eye mask at the same time.

Furthermore, the shape, size, and ratio of any element and the step sequence of any flow chart in the disclosed figures are exemplary for understanding, not for limiting the scope of this invention. In addition, although the embodiments described above take the MOSFETs as an example, the invention is not limited thereto, and the invention may be implemented by using other types of transistors.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:
1. A memory controller for adjusting impedance matching of an output terminal and outputting a control signal for controlling a memory through the output terminal, the memory controller comprising:
   a first driving and impedance matching circuit coupled between a first voltage and the output terminal;
   a second driving and impedance matching circuit coupled between a second voltage and the output terminal, wherein the second voltage is different from the first voltage; and
   a logic circuit, coupled to the first driving and impedance matching circuit and the second driving and impedance matching circuit, setting a first impedance and a first driving capability of the first driving and impedance matching circuit, setting a second impedance and a second driving capability of the second driving and impedance matching circuit, and enabling the first driving and impedance matching circuit so that the control signal has a first level or enabling the second driving and impedance matching circuit so that the control signal has a second level different from the first level;
   wherein the first driving and impedance matching circuit and the second driving and impedance matching circuit are not enabled at the same time when the control signal is being generated.
2. The memory controller of claim 1, wherein the first driving and impedance matching circuit comprises:
   a first driving circuit coupled between the first voltage and the output terminal; and a first impedance matching circuit coupled between the first voltage and the output terminal; and the second driving and impedance matching circuit comprises:

a second driving circuit coupled between the second voltage and the output terminal; and a second impedance matching circuit coupled between the second voltage and the output terminal;

wherein the logic circuit does not enable the first driving circuit and the second driving circuit at the same time.

3. The memory controller of claim 2, wherein the impedance of the first impedance matching circuit is substantially the same as the impedance of the second impedance matching circuit.

4. The memory controller of claim 2, wherein the first impedance matching circuit comprises a plurality of first transistors, the second impedance matching circuit comprises a plurality of second transistors, and the logic circuit controls the number of the first transistors which are connected in parallel to adjust the impedance of the first impedance matching circuit and controls the number of the second transistors which are connected in parallel to adjust the impedance of the second impedance matching circuit.

5. The memory controller of claim 2, wherein the logic circuit further comprises:

a register that stores a plurality of control values;

wherein the logic circuit controls the driving capability of the first driving circuit and the driving capability of the second driving circuit according to a first part of the control values and controls the impedance of the first impedance matching circuit and the impedance of the second impedance matching circuit according to a second part of the control values.

6. The memory controller of claim 1, wherein the control signal is a memory address command.

7. A memory controller for adjusting impedance matching of an output terminal and outputting a control signal for controlling a memory through the output terminal, the memory controller comprising:

a first driving circuit coupled between a first voltage and the output terminal;

a second driving circuit coupled between a second voltage and the output terminal, wherein the second voltage is different from the first voltage;

an impedance matching circuit coupled between the first voltage and the output terminal or between the second voltage and the output terminal; and a logic circuit, coupled to the first driving circuit, the second driving circuit, and the impedance matching circuit, setting a first driving capability of the first driving circuit, a second driving capability of the second driving circuit, and the impedance of the impedance matching circuit, and enabling the first driving circuit so that the control signal has a first level or enabling the second driving circuit so that the control signal has a second level different from the first level;

wherein the first driving circuit and the second driving circuit are not enabled at the same time when the control signal is being generated.

8. The memory controller of claim 7, wherein the impedance matching circuit is a first impedance matching circuit, and the first impedance matching circuit is coupled between the first voltage and the output terminal, the memory controller further comprising:

a second impedance matching circuit coupled between the second voltage and the output terminal;

wherein the impedance of the first impedance matching circuit is substantially the same as the impedance of the second impedance matching circuit.

9. The memory controller of claim 7, wherein the impedance matching circuit comprises a plurality of transistors, and the logic circuit controls the number of transistors which are connected in parallel to adjust the impedance of the impedance matching circuit.

10. The memory controller of claim 7, wherein the logic circuit further comprises:

a register that stores a plurality of control values;

wherein the logic circuit controls the driving capability of the first driving circuit and the driving capability of the second driving circuit according to a first part of the control values and controls the impedance of the impedance matching circuit according to a second part of the control values.

11. The memory controller of claim 7, wherein the control signal is a memory address command.

* * * * *